(12) United States Patent
Ahn et al.

(10) Patent No.: US 9,256,317 B2
(45) Date of Patent: Feb. 9, 2016

(54) HYBRID SENSING TOUCHSCREEN APPARATUS CAPABLE OF LIGHT TOUCH SENSING AND PHYSICAL TOUCH SENSING AND METHOD OF DRIVING THE SAME

(71) Applicant: Samsung Electronics Co., Ltd., Suwon-Si, Gyeonggi-Do (KR)

(72) Inventors: Seung-eon Ahn, Hwaseong-si (KR); I-hun Song, Hwaseong-si (KR); Ji-hoon Ahn, Yongin-si (KR); Yong-woo Jeon, Seoul (KR); Seung-hyup Lee, Yongin-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 83 days.

(21) Appl. No.: 14/141,785

(22) Filed: Dec. 27, 2013

(65) Prior Publication Data

US 2014/0184570 A1    Jul. 3, 2014

(30) Foreign Application Priority Data

Dec. 28, 2012 (KR) .......................... 10-2012-0157337

(51) Int. Cl.
G06F 3/041 (2006.01)
G06F 3/042 (2006.01)
G06F 3/044 (2006.01)

(52) U.S. Cl.
CPC .............. *G06F 3/0416* (2013.01); *G06F 3/042* (2013.01); *G06F 3/044* (2013.01)

(58) Field of Classification Search
None
See application file for complete search history.

(56) References Cited

U.S. PATENT DOCUMENTS

| 7,742,041 | B2* | 6/2010 | Lee et al. ...................... 345/173 |
| 7,999,796 | B2 | 8/2011 | Lee et al. |
| 2006/0077186 | A1* | 4/2006 | Park et al. ...................... 345/173 |
| 2009/0147191 | A1* | 6/2009 | Nakajima et al. ............. 349/116 |
| 2011/0018842 | A1 | 1/2011 | Lee et al. |
| 2011/0316812 | A1* | 12/2011 | Engla Syam .................. 345/175 |

FOREIGN PATENT DOCUMENTS

| KR | 2009-0121635 A | 11/2009 |
| KR | 2011-0077233 A | 7/2011 |

* cited by examiner

*Primary Examiner* — David D Davis
(74) *Attorney, Agent, or Firm* — Harness, Dickey & Pierce, P.L.C.

(57) ABSTRACT

A touchscreen apparatus includes pixel rows including pixels configured to display an image, a touch-sensing unit configured to sense a physical touch, light-sensing unit configured to sense incident light, a first sensor gate line configured to provide a first gate signal for activating the light-sensing unit and resetting the touch-sensing unit, a second sensor gate line configured to provide a second gate signal for activating the touch-sensing unit and resetting the light-sensing unit, and a reset circuit configured to provide a common voltage to the pixels based on the operation of at least one of the light-sensing unit and the touch-sensing unit.

20 Claims, 7 Drawing Sheets

No touch touch

HYBRID SENSING TOUCHSCREEN APPARATUS CAPABLE OF LIGHT TOUCH SENSING AND PHYSICAL TOUCH SENSING AND METHOD OF DRIVING THE SAME

CROSS-REFERENCE TO RELATED APPLICATIONS

This application claims the benefit of Korean Patent Application No. 10-2012-0157337, filed on Dec. 28, 2012, in the Korean Intellectual Property Office, the entire contents of which are incorporated herein by reference.

BACKGROUND

1. Field

The present disclosure relates to a hybrid sensing touchscreen apparatus and/or a method of driving the same, and more particularly, to an in-cell type touchscreen apparatus which performs both a touch-sensing operation of sensing a direct physical touch and a light-sensing operation of sensing light incident from a remote place, and/or a method of driving the in-cell type touchscreen apparatus.

2. Description of the Related Art

A touchscreen apparatus refers to a device capable of directly receiving input data on a display screen such that when a user's hand or pen touches a specific position of the display screen, the position is recognized for particular processing with software. Generally, the touchscreen apparatus performs its function with a display panel having a touch panel attached thereto. The touch panel may adopt several touchscreen apparatus types including a resistive type, a capacitive type, a surface acoustic wave (SAW) type, a piezoelectric type, and so forth. The touchscreen apparatus has been widely employed in various fields as an input device capable of replacing a keyboard or a mouse.

A light touchscreen apparatus has been proposed which senses light instead of a touch by the hand or the pen to perform the same function as a conventional touchscreen apparatus. The light touchscreen apparatus is expected to be useful for communication between users as well as communication between a user and a terminal.

Recently, an in-cell type touchscreen apparatus has been developed in which a separate touch panel is not mounted on a display panel and a sensing unit is formed in a pixel array of the display panel.

SUMMARY

An example embodiment discloses an in-cell type touchscreen apparatus which may perform both a touch-sensing operation of sensing a direct physical touch and a light-sensing operation of sensing light incident from a remote place.

An example embodiment discloses a method of driving the in-cell type touchscreen apparatus.

Additional aspects will be set forth in part in the description which follows and, in part, will be apparent from the description, or may be learned by practice of the presented embodiments.

According to an example embodiment, a touchscreen apparatus includes pixel rows including pixels configured to display an image, a touch-sensing unit configured to sense a physical touch and a light-sensing unit configured to sense incident light, the touch-sensing unit and the light-sensing unit being arranged between two adjacent pixel rows and configured to operate based on first and second gate signals, a first sensor gate line connected to the light-sensing unit and the touch-sensing unit and configured to provide the first gate signal for activating the light-sensing unit and resetting the touch-sensing unit, a second sensor gate line connected to both the light-sensing unit and the touch-sensing unit to provide a gate signal for activating the touch-sensing unit and resetting the light-sensing unit, and a reset circuit configured to provide a common voltage to the pixels based on the operation of at least one of the light-sensing unit and the touch-sensing unit.

The touchscreen apparatus may further include a common electrode connected to the pixels.

The reset circuit may include a common voltage line, a reset transistor configured to provide a common voltage to the pixels based on the operation at least one of the light-sensing unit and the touch-sensing unit, and a reset gate line configured to provide a third gate signal to the reset transistor.

A gate of the reset transistor may be connected to the reset gate line, a drain of the reset transistor may be connected to the common voltage line, and a source of the reset transistor may be connected to the common electrode.

The common voltage line is configured to maintain a constant common voltage.

The touch-sensing unit may include a coupling capacitor connected between the common electrode and the second sensor gate line, a source follower transistor configured to generate a sensing current corresponding to a voltage change of the common electrode, a switch transistor configured to read the sensing current, a reset transistor configured to initialize a voltage of the common electrode, and a sensor data line configured to is output the sensing current.

A gate of the source follower transistor may be connected to the common electrode, a source of the source follower transistor may be connected to a drain of the switch transistor, and a drain of the source follower transistor may be connected to the second sensor gate line.

A gate of the switch transistor may be connected to the second sensor gate line and a source of the switch transistor may be connected to the sensor data line.

A gate of the reset transistor may be connected to the first sensor gate line, a source of the reset transistor may be connected to the common electrode, and a drain of the reset transistor may be connected to the second sensor gate line.

The touchscreen apparatus may further include multiple display gate lines connected to the respective pixel rows to provide display gate signals for sequentially activating the pixel rows.

Each of the pixels may include pixel cell and a driving transistor for switching the respective pixel cell on and off, a gate of the driving transistor being connected to the display gate line and a source of the driving transistor being connected to the respective pixel cell.

The touchscreen apparatus may further include a display data line connected to a drain of the driving transistor.

After one of two display gate lines connected to two pixel rows which are adjacent to the light-sensing unit and the touch-sensing unit is activated, the first sensor gate line, the second sensor gate line, and the other of the two display gate lines may be activated sequentially in this order.

The light-sensing unit may include a light sensor transistor configured to generate a drain current in an off state according to an intensity of light, a switch transistor configured to read the drain current in the off state of the light sensor transistor, and a sensor data line configured to output the drain current.

A gate of the switch transistor may be connected to the first sensor gate line, a drain of the switch transistor may be connected to a source of the light sensor transistor, and a source of the switch transistor may be connected to the sensor data line.

A gate of the light sensor transistor may be connected to the second sensor gate line and a drain of the light sensor transistor may be connected to the first sensor gate line.

The light-sensing unit may include multiple light sensor transistors connected in parallel.

The light sensor transistor may be an oxide semiconductor transistor including a channel layer having an oxide semiconductor material.

According to another example embodiment, a method of driving a touchscreen apparatus includes activating a first pixel row including pixels, activating one of a light-sensing unit for sensing incident light and a touch-sensing unit for sensing a physical touch, the light-sensing unit and touch-sensing unit being adjacent to the first pixel row, and resetting the other of the light-sensing unit and the touch-sensing unit, resetting the activated one of the light-sensing unit and the touch-sensing unit and activating the reset other of the light-sensing unit and the touch-sensing unit, and activating a second pixel row including additional pixels, the second pixel row being adjacent to the light-sensing unit and the touch-sensing unit, applying a common voltage to the pixels when the first and second pixel rows are in an activated state, and prohibit providing the common voltage to the pixels when the light-sensing unit or the touch-sensing unit is in an activated state.

The pixels in the first and second pixel rows may be commonly connected to one common electrode.

The touchscreen apparatus may include a common voltage line, includes a reset transistor connected between the common voltage line and the common electrode, and a reset gate line configured to provide a gate signal to the reset transistor, and the reset transistor may be switched to provide a common voltage to the pixels in an activated state of the pixels and to not provide the common voltage to the pixels in the activated state of one of the light-sensing unit and the touch-sensing unit.

The common voltage line may maintain a constant common voltage, and the reset gate line may be activated in the activated state of the pixels to turn on the reset transistor and may be deactivated in the activated state of the light-sensing unit or the touch-sensing unit to turn off the reset transistor.

The touchscreen apparatus may include first and second sensor gate lines connected to the light-sensing unit and the touch-sensing unit, the light-sensing unit may be activated and the touch-sensing unit is reset in an activated state of the first sensor gate line, and the touch-sensing unit may be activated and the light-sensing unit is reset in an activated state of the second sensor gate line.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
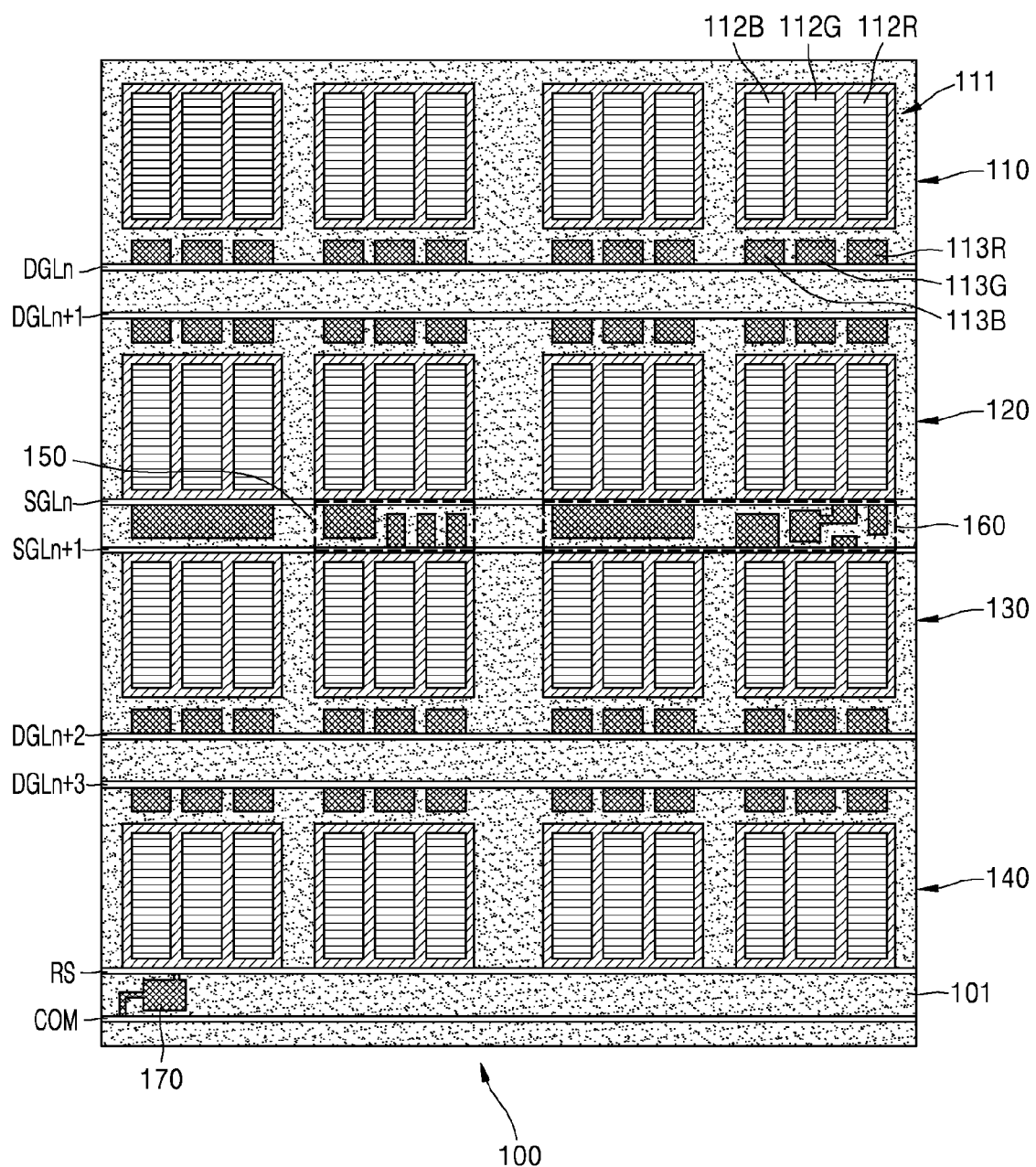
FIG. 1 is a schematic layout of a unit pixel array showing a structure of a touchscreen apparatus according to an example embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

Hereinafter, a hybrid sensing touchscreen apparatus and a method of driving the in-cell type touchscreen apparatus will be described in detail with reference to the accompanying drawings. Throughout the drawings, like reference numerals refer to like components and the size of each component may be exaggerated for clarity and convenience of description.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic layout of a unit pixel array showing a structure of a touchscreen apparatus 100 according to an example embodiment of the present disclosure. Referring to FIG. 1, the touchscreen apparatus 100 according to an embodiment of the present disclosure is an in-cell type touchscreen apparatus which may perform both a touch-sensing operation of sensing a direct physical touch and a light-sensing operation of sensing light incident from a remote place. For example, the touchscreen apparatus 100 may include first through fourth pixel rows 110, 120, 130, and 140 in which pixels for displaying an image are arranged, a light-sensing unit 150 for sensing incident light, and a touch-sensing unit 160 for sensing a physical touch. Herein, the first, second, third, and fourth pixel rows 110, 120, 130, and 140, the light-sensing unit 150, and the touch-sensing unit 160 may be formed together on a substrate 101.

Each of the first, second, third, and fourth pixel rows 110, 120, 130, and 140 may include pixels 111 arranged in a row along a row direction. Though only four pixels 111 in each pixel row are shown in FIG. 1 for convenience, a larger number of pixels 111 may be arranged in each pixel row. Each pixel 111 may include a blue pixel cell 112B, a green pixel cell 112G, a red pixel cell 112R, and driving circuits 113B, 113G, and 113R for separately switching the blue, green, and red pixel cells 112B, 112G, and 112R on/off.

First through fourth display gate lines DGLn, DGLn+1, DGLn+2, and DGLn+3 may be respectively connected to the first, second, third, and fourth pixel rows 110, 120, 130, and 140 to provide a gate signal to driving circuits 113B, 113G, and 113R. For example, upon activation of the first display gate line DGLn connected to the first pixel row 110, the driving circuits 113B, 113G, and 113R of the first pixel row 110 are turned on, such that an image signal is input to the blue, green, and red pixel cells 112B, 112G, and 112R of the first pixel row 110. Thereafter, the first display gate line DGLn is deactivated and the second display gate line DGLn+1 is activated, such that an image signal is input to the blue, green, and red pixel cells 112B, 112G, and 112R of the second pixel row 120. In this way, for the first, second, third, and fourth pixel rows 110, 120, 130, and 140, one-by-one, the first through fourth display gate lines DGLn, DGLn+1, DGLn+2, and DGLn+3 are sequentially activated, such that an image signal is input to all of the pixels 111.

The light-sensing unit 150 and the touch-sensing unit 160 may be disposed together between two adjacent pixel rows, namely, the second and third pixel rows 120 and 130. In FIG. 1, it is shown that the light-sensing unit 150 and the touch-sensing unit 160 are disposed together, for example, between the second pixel row 120 and the third pixel row 130. Since an area of incident light or an area of a physical touch is much larger than a size of one pixel 111, the light-sensing unit 150 and the touch-sensing unit 160 may be disposed for every multiple pixels. For example, it is shown in FIG. 1 that one light-sensing unit 150 and one touch-sensing unit 160 are disposed for every 16 pixels, but the present disclosure is not limited thereto.

Two sensor gate lines, namely, first and second sensor gate lines SGLn and SGLn+1, are connected to the light-sensing unit 150 and the touch-sensing unit 160. For example, the light-sensing unit 150 and the touch-sensing unit 160 may be configured such that when the first sensor gate line SGLn is activated, the light-sensing unit 150 may be activated to sense incident light and the touch-sensing unit 160 may be reset. The light-sensing unit 150 and the touch-sensing unit 160 may also be configured such that when the second sensor gate line SGLn+1 is activated, the light-sensing unit 150 may be reset and the touch-sensing unit 160 may be activated to sense a physical touch. A detailed structure for this end will be described in more detail later.

Although not shown in FIG. 1, the touchscreen apparatus 100 may further include a gate driver for sequentially providing a gate signal to the first through fourth display gate lines DGLn, DGLn+1, DGLn+2, and DGLn+3 and the first and second sensor gate lines SGLn and SGLn+1. That is, the first through fourth display gate lines DGLn, DGLn+1, DGLn+2, and DGLn+3 and the first and second sensor gate lines SGLn and SGLn+1 may be connected to the same gate driver. For example, in an embodiment shown in FIG. 1, the gate driver may provide a gate signal to the first display gate line DGLn, the second display gate line DGLn+1, the first sensor gate line SGLn, the second sensor gate line SGLn+1, the third display gate line DGLn+2, and the fourth display gate line DGLn+3 sequentially in this order. Thus, after an image is displayed sequentially in the first and second pixel rows 110 and 120, the light-sensing unit 150 and the touch-sensing unit 160 sequentially sense incident light and a physical touch, and then an image may be displayed sequentially in the third and fourth pixel rows 130 and 140.

FIG. 1 shows only one unit pixel array having pixels that are commonly connected to one common electrode 105 (see FIG. 8), rather than the whole touchscreen apparatus 100. In the current embodiment, the common electrode 105 provides a common voltage to the pixels 111 during the display of an image and also serves as a sensing electrode of a capacitor (see FIGS. 7 and 8) in the touch-sensing unit 160 during sensing of a physical touch. In this case, the common electrode 105 is distributed over a large area to thereby increase the sensitivity of the touch-sensing unit 160.

In this structure, during the display of an image, the voltage of the common electrode 105 is maintained constant; however, during sensing of a physical touch, the voltage of the common electrode 105 changes with an area of the touch. Thus, since the voltage of the common electrode 105 may be changed after the touch-sensing operation, the voltage of the common electrode 105 may be initialized when the image is displayed. For the initialization operation, the touchscreen apparatus 100 may further include a common voltage line COM to which the common voltage is applied, a reset transistor 170 which is switched to provide the common voltage to the pixels 111 during activation of the pixels 111 and to not provide the common voltage to the pixels 111 during activation of the light-sensing unit 150 or the touch-sensing unit 160, and a reset circuit including a reset gate line RS for providing a gate signal to the reset transistor 170. For example, during the display of the image, the reset gate line RS is activated such that the reset transistor 170 is turned on. Then, the common voltage line COM is connected with the common electrode 105, such that the common voltage is provided to the common electrode 105. On the other hand, when the first sensor gate line SGLn or the second sensor gate line SGLn+1 is activated for touch-sensing, the reset gate line RS is deactivated such that the reset transistor 170 is turned off. Then, the common voltage line COM and the common electrode 105 may be disconnected.

It is shown in FIG. 1 that each unit pixel array having pixels connected to one common electrode 105 includes 16 pixels 111, one light-sensing unit 150, and one touch-sensing unit 160. However, such an illustration is merely an example, and the number of pixels, light-sensing units 150, and touch-sensing units 160 disposed in a unit pixel array may be selected variously according to an embodiment. The touchscreen apparatus 100 may include unit pixel arrays structured as the one described above. For example, unit pixel arrays may be arranged in the form of a two-dimensional (2D) matrix array.

Hereinafter, a detailed circuit structure and operation of each component of the touchscreen apparatus 100 will be described in detail.

Figure 2A:
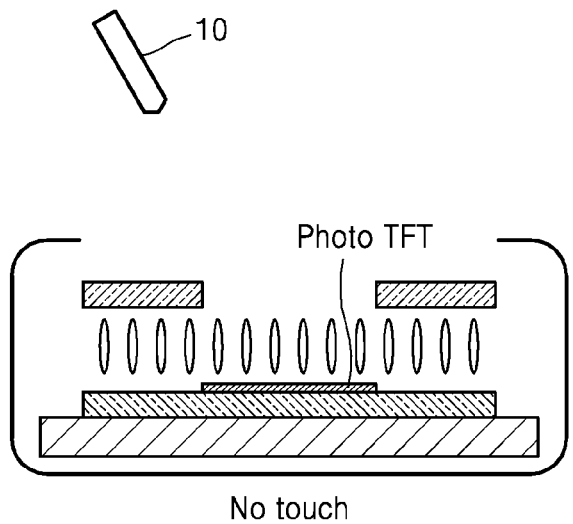
FIGS. 2A and 2B are diagrams showing an operation of a light-sensing unit of the touchscreen apparatus shown in FIG. 1.
Figure 2B:
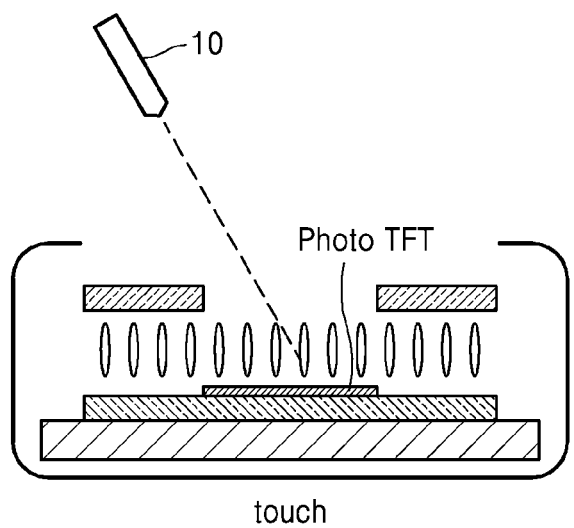

FIGS. 2A and 2B are example diagrams showing an operation of the light-sensing unit 150 of the touchscreen apparatus 100 shown in FIG. 1. The light-sensing unit 150 uses a principle in which when a light sensor transistor is turned off, a drain current changes according to whether light is incident. Referring to FIGS. 2A and 2B, a black matrix may be filled in a region between pixels, but a region in which the light sensor transistor is disposed may be optically opened to allow light to be incident thereto. As shown in FIG. 2A, when light is not incident from a light source device 10 such as a laser pointer, a light touch does not occur. As shown in FIG. 2B, if light is incident to a particular region of the touchscreen apparatus 100 from the light source device 10, the light-sensing unit 150 may sense a drain current of the light sensor transistor and determine that the light touch occurs. Thus, a touch action based on sensing of a typical physical touch may be implemented by sensing incident light. Such a light touch technique may enable a remote touch in a large display device such as an electronic board, a large smart TV, or the like.

The light sensor transistor of the light-sensing unit 150 may use an oxide semiconductor transistor. The oxide semiconductor transistor means a transistor using oxide semiconductor as a material of a channel. Such an oxide semiconductor transistor may be sensitive to light according to an oxide semiconductor material used as a channel layer. When the oxide semiconductor material, which is sensitive to light, is used as a channel layer, the oxide semiconductor transistor may be used as a light-sensing device because a drain current changes according to the wavelength or intensity of incident light. For example, as the oxide semiconductor channel material, an oxide semiconductor material such as ZnO, InO, SnO, InZnO, ZnSnO, or InSnO may be used, or a combination of the oxide semiconductor material with one or more of Hf, Zr, Ti, Ta, Ga, Nb, V, Al, and Sn may be used.

In addition, the oxide semiconductor transistor may be controlled to react at a particular wavelength according to an oxide semiconductor material of the channel layer, such that by using the oxide semiconductor transistor, malfunction of the light-sensing unit 150 due to external light may be prevented. For example, an oxide semiconductor transistor manufactured to be sensitive to blue light may be used as the light sensor transistor and a laser pointer which emits blue light may be used as the light source device 10. Since external light generally has a combination of lights of various wavelengths, light emitted from the light source device 10 may be distinguished from general external light.

Figure 3:
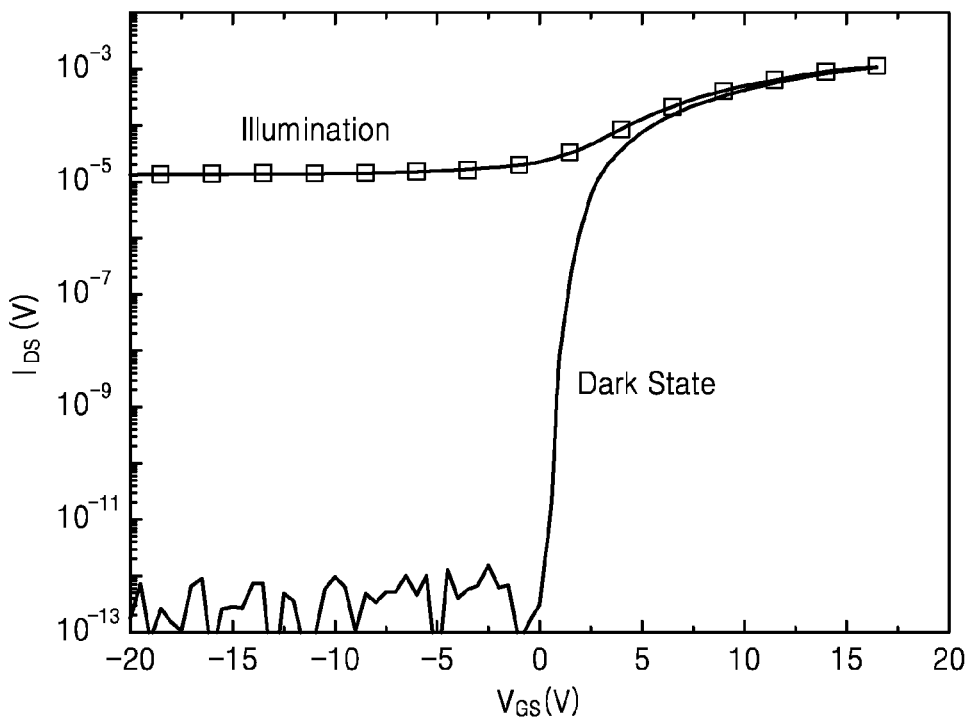
FIGS. 3 and 4 are graphs showing operational characteristics of an oxide semiconductor transistor.
Figure 4:
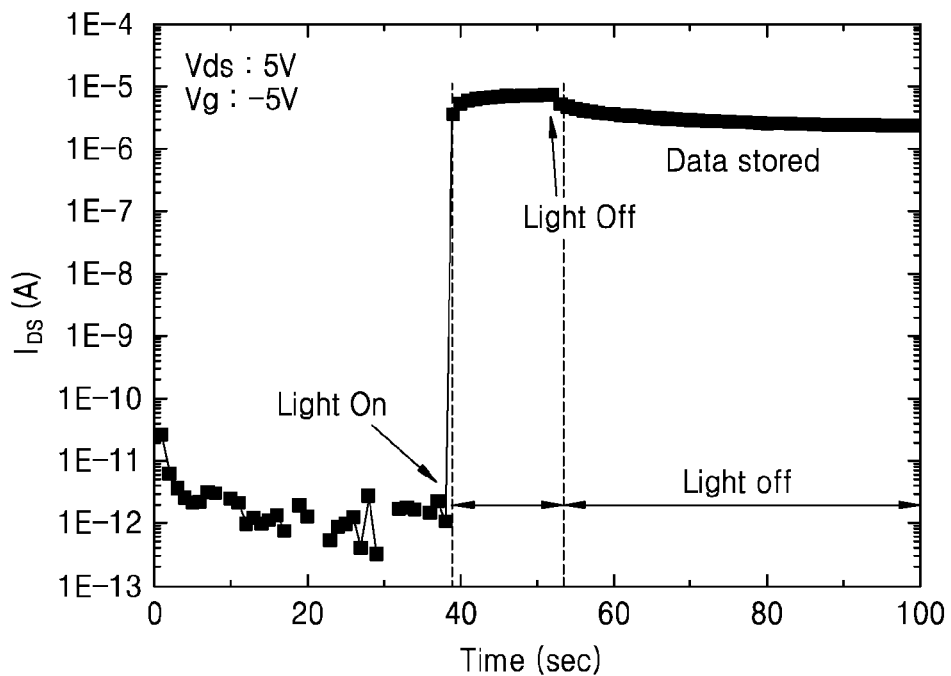

FIGS. 3 and 4 are graphs showing operational characteristics of the oxide semiconductor transistor. FIG. 3 shows characteristics of a drain current $I_{DS}$ with respect to a gate voltage $V_{GS}$ in the oxide semiconductor transistor, and FIG. 4 shows a change of the drain current $I_{DS}$ over time after light is incident to the oxide semiconductor transistor.

It may be seen from FIG. 3 that, when light is incident to the oxide semiconductor transistor, the drain current $I_{DS}$ increases in an off state of the oxide semiconductor transistor. For example, when a gate voltage $V_{GS}$ higher than a threshold voltage is applied to the oxide semiconductor transistor, as in the right side of the graph shown in FIG. 3, the drain current $I_{DS}$ corresponding to incidence of light and the drain current $I_{DS}$ corresponding to non-incidence of light are almost the same. However, when a gate voltage $V_{GS}$ lower than the threshold voltage is applied to the oxide semiconductor transistor, as in the left side of the graph shown in FIG. 3, the drain current $I_{DS}$ corresponding to incidence of light increases by a larger amount than the drain current $I_{DS}$ corresponding to non-incidence of light. Therefore, it may be determined whether light is incident by measuring the drain current $I_{DS}$ during the application of a gate voltage $V_{GS}$ lower than the threshold voltage to the oxide semiconductor transistor.

Referring to FIG. 4, light is incident to the oxide semiconductor transistor after about 40 seconds, such that the drain current $I_{DS}$ increases. However, after about 55 seconds, even if incidence of light is stopped, the drain current $I_{DS}$ does not decrease and maintains a state similar to a state corresponding to incidence of light. It may be understood that this phenomenon occurs due to trapping of electric charges inside the channel layer of the oxide semiconductor transistor or an interface between a gate insulating layer and the channel layer. For example, when a negative (−) gate voltage, together with light, is applied to the oxide semiconductor transistor, holes generated by light inside the channel layer may move to and be trapped in an interface between a gate insulating layer and a channel layer. The trapped electric charges are not removed until a positive (+) gate voltage of a sufficiently large amount is applied to a gate. Thus, after the electric charges are trapped, the drain current $I_{DS}$ does not decrease even after the incidence of light is stopped. This phenomenon may disappear if the gate voltage $V_{GS}$ of a sufficiently large amount is applied to the oxide semiconductor transistor to remove the trapped electric charges.

Figure 5:
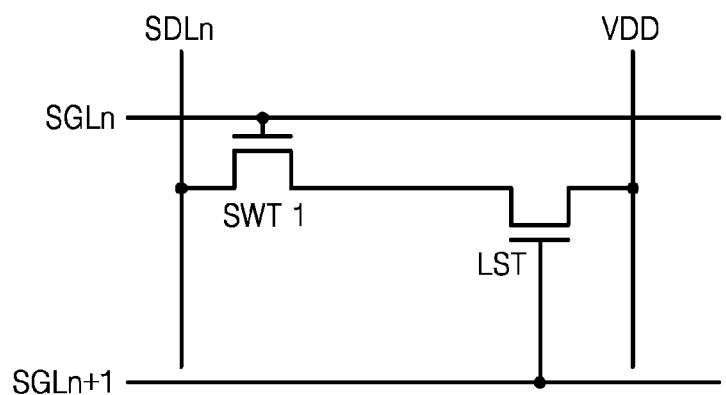
FIG. 5 is a circuit diagram showing an equivalent circuit of a light-sensing unit of the touchscreen apparatus using a concept described with reference to FIGS. 2A and 2B.

FIG. 5 is a circuit diagram showing an equivalent circuit of the light-sensing unit 150 using the above-described oxide semiconductor transistor. Referring to FIG. 5, the light-sensing unit 150 may include a switch transistor SWT1 and a light sensor transistor LST, which are serially connected with each other. For example, a source of the light sensor transistor LST and a drain of the switch transistor SWT1 may be connected to each other. In addition, a first sensor gate line SGLn may be connected to a gate of the switch transistor SWT1, and a first sensor data line SDLn may be connected to a source of the switch transistor SWT1. A driving voltage line VDD may be connected to a drain of the light sensor transistor LST, and a second sensor gate line SGLn+1 may be connected to a gate of the light sensor transistor LST. The light sensor transistor LST may be the above-described oxide semiconductor transistor.

In the light-sensing unit 150 described above, if a gate voltage is applied to the switch transistor SWT1 upon activation of the first sensor gate line SGLn, the switch transistor SWT1 is turned on. Then, current flows from the source of the light sensor transistor LST to the first sensor data line SDLn. The amount of current flowing from the light sensor transistor LST to the first sensor data line SDLn changes according to the intensity of light incident to the light sensor transistor LST. As mentioned above, a change of current by light occurs when the oxide semiconductor transistor is turned off. Thus, during the activated state of the first sensor gate line SGLn, the second sensor gate line SGLn+1 is deactivated such that the light sensor transistor LST is turned off. In this state, the intensity of light incident to the light sensor transistor LST may be calculated by measuring the amount of current flowing through the first sensor data line SDLn.

On the other hand, if the first sensor gate line SGLn is deactivated, the switch transistor SWT1 is turned off such that current does not flow through the first sensor data line SDLn. As described before, after light is incident to the oxide semiconductor transistor, a drain current does not naturally decrease even if the incidence of the light is stopped, and thus the oxide semiconductor transistor needs to be temporarily turned on to initialize the oxide semiconductor transistor. Thus, during the deactivated state of the first sensor gate line SGLn, the second sensor gate line SGLn+1 is activated for a next sensing. Then, the light sensor transistor LST may be reset by the application of a gate voltage to the light sensor transistor LST.

Figure 6:
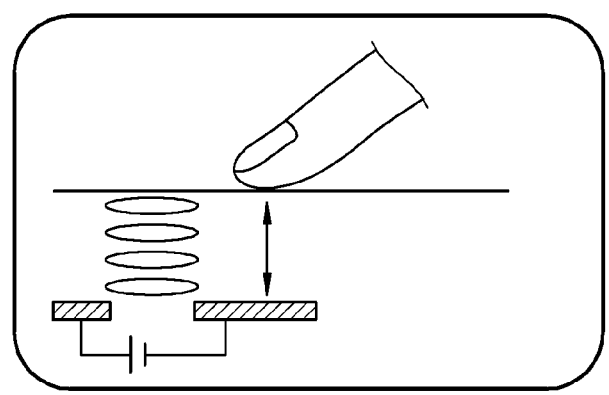
FIG. 6 is a diagram showing an operation of a touch-sensing unit of the touchscreen apparatus shown in FIG. 1.

FIG. 6 is an example diagram showing an operation of the touch-sensing unit 160 of the touchscreen apparatus 100 shown in FIG. 1. Referring to FIG. 6, the touchscreen apparatus 100 may use, for example, an in-plane switch (IPS) panel which drives pixel cells between two electrodes on the same plane. In this structure, one of the two electrodes which drive the pixel cells may serve as a sensing electrode connected with a capacitor. As shown in FIG. 6, if a finger, which is a conductor, touches the surface of the touchscreen apparatus 100, a parasitic capacitance is generated between the sensing electrode and the finger, and by the parasitic capacitance, the voltage of the sensing electrode changes. Therefore, by sensing a voltage change of the sensing electrode, a physical touch may be sensed. As described previously, to improve sensitivity, a common electrode to which multiple pixel cells are commonly connected may be selected as the sensing electrode.

Figure 7:
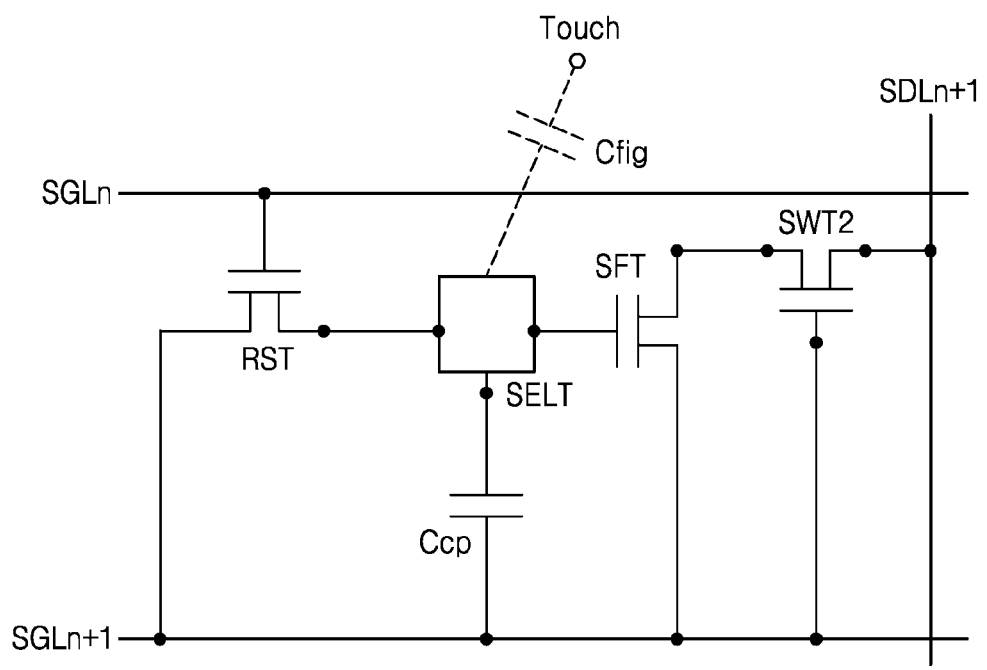
FIG. 7 is a circuit diagram showing an equivalent circuit of a touch-sensing unit of the touchscreen apparatus using a concept described in FIG. 6.

FIG. 7 is a circuit diagram showing an equivalent circuit of the touch-sensing unit 160 of the touchscreen apparatus 100 using the concept described in FIG. 6. Referring to FIG. 7, the touch-sensing unit 160 may include a switch transistor SWT2, a source follower transistor SFT, a reset transistor RST, and a coupling capacitor $C_{cp}$. In the source follower transistor SFT, a gate is connected to a sensing electrode SELT, a source is connected to a drain of the switch transistor SWT2, and a drain is connected to the second sensor gate line SGLn+1. In the switch transistor SWT2, a gate is connected to the second sensor gate line SGLn+1, a drain is connected to the source of the source follower transistor SFT, and a source is connected to the second sensor data line SDLn+1. In the reset transistor RST, a gate is connected to the first sensor gate line SGLn, a source is connected to the sensing electrode SELT, and a drain is connected to the second sensor data line SDLn+1. One terminal of the coupling capacitor $C_{cp}$ is connected to the sensing electrode SELT and the other terminal thereof is connected to the second sensor gate line SGLn+1. As mentioned previously, the sensing electrode SELT may be a common electrode.

In the structure shown in FIG. 7, if the first sensor gate line SGLn is activated and the second sensor gate line SGLn+1 is deactivated, the switch transistor SWT2 is turned off such that no signal is provided to the second sensor data line SDLn+1. In addition, the reset transistor RST is turned on such that the both terminals of the coupling capacitor $C_{cp}$ are initialized to the same potential.

Thereafter, if the first sensor gate line SGLn is deactivated and the second sensor gate line SGLn+1 is activated, the switch transistor SWT2 is turned on and the reset transistor RST is turned off. Then, sensing current generated in the source follower transistor SFT corresponding to the voltage change of the sensing electrode SELT may be provided to the second sensor data line SDLn+1 through the switch transistor SWT2. The voltage change of the sensing electrode SELT may correspond to a capacitance ratio between the coupling capacitor $C_{cp}$ and a finger capacitor $C_{fig}$. Herein, the finger capacitor $C_{fig}$ is a virtual capacitor generated when a conductor such as a finger touches the touchscreen apparatus 100.

If there is no finger touch, the finger capacitor $C_{fig}$ is not formed. In this case, the voltage of the sensing electrode SELT may be applied to the gate of the source follower transistor SFT. On the other hand, for example, if the finger capacitor $C_{fig}$ having the same capacitance as that of the coupling capacitor $C_{cp}$ is formed by a finger touch, the voltage applied to the gate of the source follower transistor SFT may be reduced to ½. The amount of current flowing from the second sensor gate line SGLn+1 to the switch transistor SWT2 changes according to the magnitude of the voltage applied to the gate of the source follower transistor SFT, such that the amount of current flowing through the second sensor data line SDLn+1 changes. Therefore, by sensing the current change of the second sensor data line SDLn+1, it may be determined whether the finger touch has been made.

Figure 8:
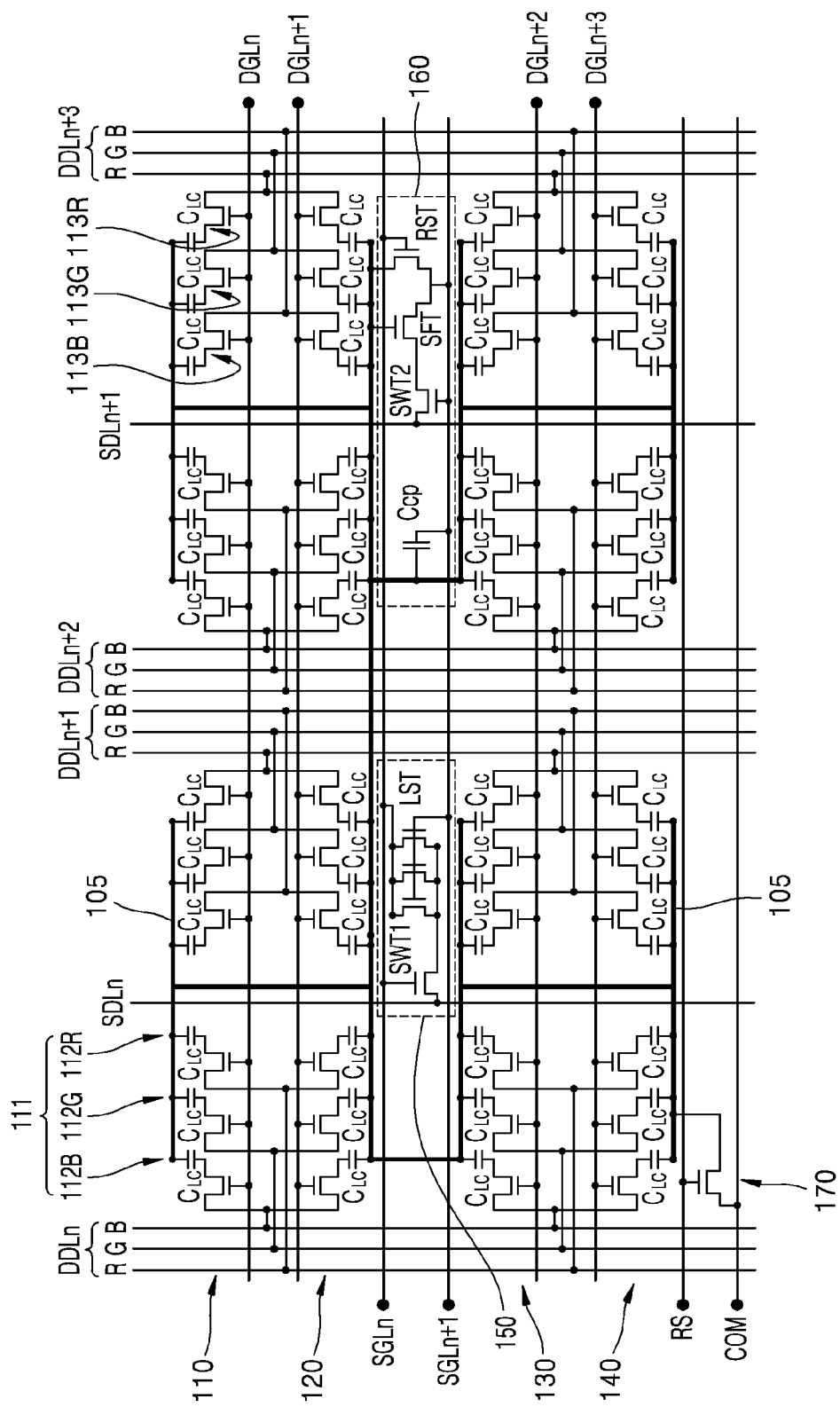
FIG. 8 is a circuit diagram showing a pixel structure of the touchscreen apparatus which employs the equivalent circuit of the light-sensing unit shown in FIG. 5 and the equivalent circuit of the touch-sensing unit shown in FIG. 7.

FIG. 8 is a circuit diagram showing a pixel structure of the touchscreen apparatus 100 which employs the equivalent circuit of the light-sensing unit 150 shown in FIG. 5 and the equivalent circuit of the touch-sensing unit 160 shown in FIG. 7. Referring to FIG. 8, the touchscreen apparatus 100 includes the first, second, third, and fourth pixel rows 110, 120, 130, and 140, in each of which the pixels 111 are arranged. Each pixel 111 includes the blue pixel cell 112B, the green pixel cell 112G, the red pixel cell 112R, and the driving circuits 113B, 113G, and 113R respectively switch the blue, green, and red pixel cells 112B, 112G, and 112R on/off.

For example, each of the driving circuits 113B, 113G, and 113R may include one transistor. As shown in FIG. 8, a gate of the transistor may be connected to the first, second, third, and fourth display gate lines DGLn, DGLn+1, DGLn+2, and DGLn+3, and a drain thereof may be connected to first, second, third, and fourth display data lines DDLn, DDLn+1, DDLn+2, and DDLn+3 each including red, green, and blue data lines R, G, and B respectively corresponding to the red, green, and blue pixel cells 112R, 112G, and 112B. A source of the transistor is connected to pixel electrodes disposed at ends of the red, green, and blue pixel cells 112R, 112G, and 112B. The common electrode 105 shown as a bold line in FIG. 8 is connected to the other ends of the red, green, and blue pixel cells 112R, 112G, and 112B. As shown in FIG. 8, the common electrode 105 may be commonly connected to all the red, green, and blue pixel cells 112R, 112G, and 112B in each unit pixel.

The light-sensing unit 150 shown in FIG. 5 and the touch-sensing unit 160 shown in FIG. 7 are disposed between the second pixel row 120 and the third pixel row 130. As shown in FIG. 8, a gate of the switch transistor SWT1 of the light-sensing unit 150 and a gate of the reset transistor RST of the touch-sensing unit 160 are connected to the first sensor gate line SGLn, and a gate of the light sensor transistor LST of the light-sensing unit 150 and a gate of the switch transistor SWT2 of the touch-sensing unit 160 are connected to the second sensor gate line SGLn+1. While it is shown in FIG. 8 that three light sensor transistors LST are connected in parallel, one light sensor transistor LST may be disposed as shown in FIG. 5. By connecting multiple light sensor transistors LST in parallel, the sensitivity of light sensing may be improved. In the embodiment shown in FIG. 8, the light-sensing unit 150 does not have a separate driving voltage line, and by connecting the drain of the light sensor transistor LST to the first sensor gate line SGLn, the first sensor gate line SGLn may provide a driving voltage to the light sensor transistor LST.

One terminal of the coupling capacitor $C_{cp}$ of the touch-sensing unit 160 is connected to the common electrode 105, and the other terminal thereof is connected to the second sensor gate line SGLn+1. Therefore, the common electrode 105 may serve as a sensing electrode of the touch-sensing unit 160. In the embodiment shown in FIG. 8, a drain of the reset transistor RST is connected to the second sensor gate line SGLn+1, and a source thereof is connected to the common electrode 105.

A common voltage line COM, a reset gate line RS, and the reset transistor 170 are disposed adjacent to the fourth display gate line DGLn+3. As shown in FIG. 8, the reset gate line RS is connected to a gate of the reset transistor 170, the common voltage line COM is connected to a drain of the reset transistor 170, and the common electrode 105 is connected to a source of the reset transistor 170. Thus, upon activation of the reset gate line RS, the reset transistor 170 is turned on, such that a common voltage of the common voltage line COM may be applied to the common electrode 105.

Figure 9:
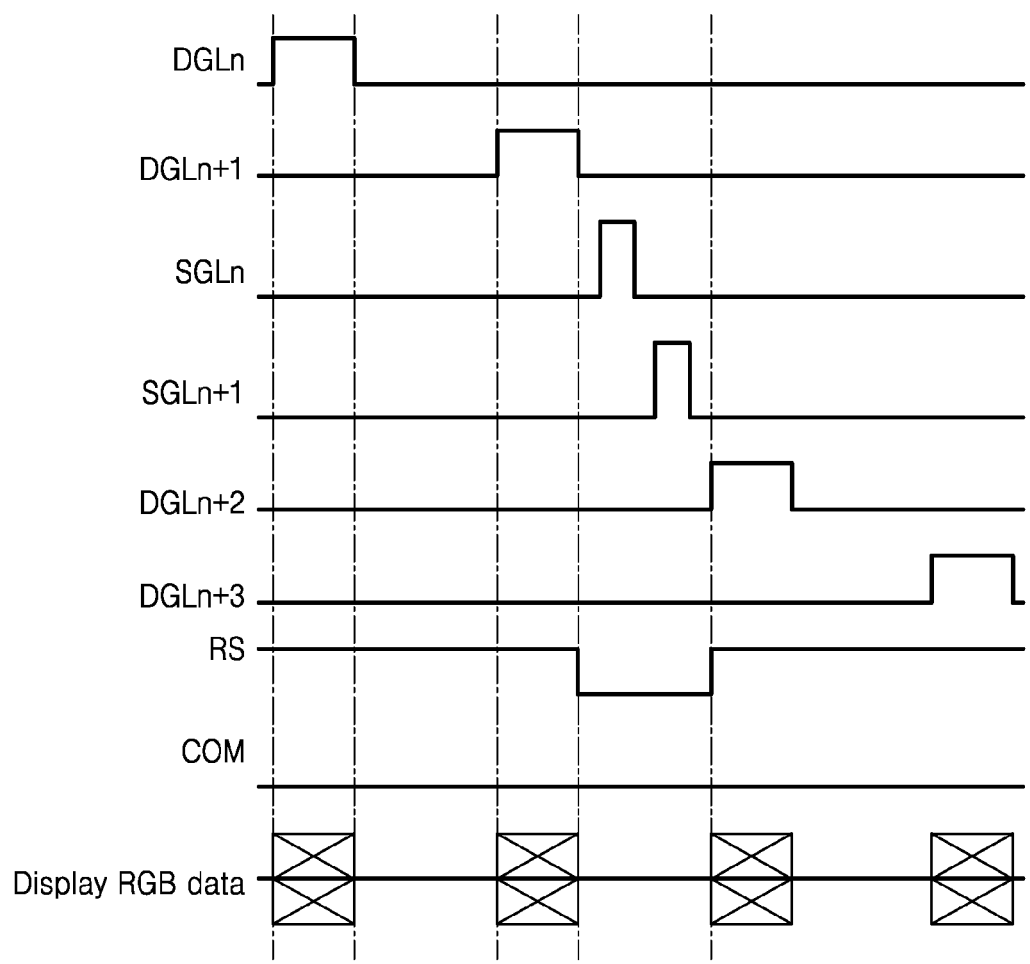
FIG. 9 is a timing diagram for describing a method of driving the in-cell type touchscreen apparatus shown in FIG. 8.

FIG. 9 is a timing diagram for describing a method of driving the in-cell type touchscreen apparatus 100 shown in FIG. 8. Referring to FIG. 9, the first display gate line DGLn, the second display gate line DGLn+1, the first sensor gate line SGLn, the second sensor gate line SGLn+1, the third display gate line DGLn+2, and the fourth display gate line DGLn+3 may be activated sequentially in this order. The reset gate line RS is activated in the activated state of the first, second, third, and fourth display gate lines DGLn, DGLn+1, DGLn+2, and DGLn+3, such that the reset transistor 170 is turned on; however, in the activated state of the sensor gate lines SGLn and SGLn+1, the reset gate line RS is deactivated, such that the reset transistor 170 is turned off. Thus, only in the activated state of the first, second, third, and fourth display gate lines DGLn, DGLn+1, DGLn+2, and DGLn+3, the common voltage is applied to the common electrode 105, and during the light sensing and touch-sensing operations, the common voltage is not applied to the common electrode 105. In the common voltage line COM, a constant common voltage is maintained at all times.

First, upon activation of the first display gate line DGLn, an image signal may be provided to the red, green, and blue pixel cells 112R, 112G, and 112B of the first pixel row 110 from the display data lines DDLn, DDLn+1, DDLn+2, and DDLn+3. Next, upon activation of the second display gate line DGLn+1, an image signal may be provided to the red, green, and blue pixel cells 112R, 112G, and 112B of the second pixel row 120 from the display data lines DDLn, DDLn+1, DDLn+2, and DDLn+3.

Thereafter, upon activation of the first sensor gate line SGLn, the switch transistor SWT1 of the light-sensing unit 150 is turned on, such that the light-sensing operation is performed. In this case, the reset gate line RS is deactivated, such that the reset transistor 170 is turned off, thereby stopping applying the common voltage to the common electrode 105. As the reset transistor RST of the touch-sensing unit 160 is turned on, the touch-sensing unit 160 is reset. For example, in the activated state of the first and second display gate lines DGLn and DGLn+1, the common voltage is applied to one terminal of the coupling capacitor $C_{cp}$ connected to the common electrode 105 and a negative bias voltage is applied to the other terminal of the coupling capacitor $C_{cp}$ connected to the second sensor gate line SGLn+1. Then, as the reset transistor RST is turned on by activation of the first sensor gate line SGLn, both terminals of the coupling capacitor $C_{cp}$ are initialized to the same voltage. Since the reset transistor 170 is turned off, the common electrode 105 is disconnected to the common voltage line COM and a negative bias voltage of the second sensor gate line SGLn+1 is applied to the common electrode 105.

Next, upon activation of the second sensor gate line SGLn+1, the light sensor transistor LST of the light-sensing unit 150 is turned on, such that the light-sensing unit 150 is reset, and as the switch transistor SWT2 of the touch-sensing unit 160 is turned on, the touch-sensing operation is performed. In the embodiment shown in FIG. 8, it is shown that the light-sensing unit 150 is reset and the touch-sensing unit 160 is activated after the light-sensing unit 150 is first activated and the touch-sensing unit 160 is reset. However, this is merely an example, and the present disclosure is not limited thereto. For example, the touchscreen apparatus 100 may be configured such that, after the touch-sensing unit 160 is first activated and the light-sensing unit 150 is reset, the touch-sensing unit 160 may be reset and the light-sensing unit 150 may be activated.

When the third and fourth display gate lines DGLn+2 and DGLn+3 are sequentially activated, the reset gate line RS is activated again and then, the common electrode 105 whose voltage was changed during the touch sensing operation is initialized to the common voltage. Also, image signals may be provided sequentially to the third pixel row 130 and the fourth pixel row 140.

As shown in the timing diagram of FIG. 9, time intervals between activation sections of every two adjacent display gate lines among the first, second, third, and fourth display gate lines DGLn, DGLn+1, DGLn+2, and DGLn+3 may be the same. For example, a time interval between activation sections of the first display gate line DGLn and the second display gate line DGLn+1 is the same as a time interval between activation sections of the second display gate line DGLn+1 and the third display gate line DGLn+2. Thus, even if the light-sensing and touch-sensing operations are performed during a process in which the first, second, third, and fourth pixel rows 110, 120, 130, and 140 are sequentially scanned and an image signal is provided, for example, prior to scanning of the third pixel row 130 after scanning of the second pixel row 120, a delay does not occur in an overall image display time.

As can be seen from the foregoing description, the touchscreen apparatus 100 according to the current embodiment may perform both the touch-sensing operation of sensing a direct physical touch and the light-sensing operation of sensing light incident from a remote place. Moreover, the light-sensing unit 150 for performing the light-sensing operation and the touch-sensing unit 160 for performing the touch-sensing operation are formed together in a pixel array which displays an image, thereby implementing the in-cell type touchscreen apparatus 100 capable of performing hybrid sensing.

Furthermore, according to the current embodiment, the number of reset transistors for resetting the sensing units, namely, the light-sensing unit 150 and the touch-sensing unit 160, of the touchscreen apparatus 100 may be minimized. For example, when one light-sensing unit 150 and one touch-sensing unit 160 are disposed for every four pixel rows 110, 120, 130, and 140, only two reset transistors RST and 170 are used in a unit pixel array including the four pixel rows 110, 120, 130, and 140. Therefore, the number of transistors may be reduced when compared to a design in which a reset transistor is disposed for every gate line. As a result, by suppressing an increase in a parasitic capacitance caused by an increase in the number of transistors, the sensitivity of touch sensing may be improved. In addition, by suppressing the increase in the parasitic capacitance, driving of the touchscreen apparatus 100 may be efficiently performed and power consumption of the touchscreen apparatus 100 may be reduced. Accordingly, the touchscreen apparatus 100 according to the current embodiment may be manufactured to have a large size.

So far, example embodiments of a hybrid sensing touchscreen apparatus and a method of driving the same have been described and shown in the accompanying drawings to facilitate understanding of the present disclosure. However, it should be understood that these embodiments are merely intended to illustrate the present disclosure and not to limit the present disclosure. It should also be understood that the present disclosure is not limited by the shown and described description. This is because other various modifications may be made by those of ordinary skill in the art.

What is claimed is:

1. A touchscreen apparatus comprising:
pixel rows including pixels configured to display an image;
a touch-sensing unit configured to sense a physical touch and a light-sensing unit configured to sense incident light, the touch-sensing unit and the light-sensing unit being between two adjacent pixel rows and configured to operate based on first and second gate signals;
a first sensor gate line connected to the light-sensing unit and the touch-sensing unit and configured to provide the first gate signal for activating the light-sensing unit and resetting the touch-sensing unit;
a second sensor gate line connected to both the light-sensing unit and the touch-sensing unit and configured to provide the second gate signal for activating the touch-sensing unit and resetting the light-sensing unit; and
a reset circuit configured to provide a common voltage to the pixels based on the operation of at least one of the light-sensing unit and the touch-sensing unit.

2. The touchscreen apparatus of claim 1, further comprising:
a common electrode connected to the pixels.

3. The touchscreen apparatus of claim 2, wherein the reset circuit comprises:
a common voltage line;
a reset transistor configured to provide the common voltage to the pixels based on the operation of at least one of the light-sensing unit and the touch-sensing unit; and
a reset gate line configured to provide a third gate signal to the reset transistor,
wherein a gate of the reset transistor is connected to the reset gate line, a drain of the reset transistor is connected to the common voltage line, and a source of the reset transistor is connected to the common electrode.

4. The touchscreen apparatus of claim 3, wherein the common voltage line is configured to maintain a constant common voltage.

5. The touchscreen apparatus of claim 2, wherein the touch-sensing unit comprises:
a coupling capacitor connected between the common electrode and the second sensor gate line;
a source follower transistor configured to generate a sensing current corresponding to a voltage change of the common electrode;
a switch transistor configured to read the sensing current;
a reset transistor configured to initialize a voltage of the common electrode; and
a sensor data line configured to output the sensing current.

6. The touchscreen apparatus of claim 5, wherein a gate of the source follower transistor is connected to the common electrode, a source of the source follower transistor is connected to a drain of the switch transistor, and a drain of the source follower transistor is connected to the second sensor gate line.

7. The touchscreen apparatus of claim 5, wherein a gate of the switch transistor is connected to the second sensor gate line and a source of the switch transistor is connected to the sensor data line, and
wherein a gate of the reset transistor is connected to the first sensor gate line, a source of the reset transistor is connected to the common electrode, and a drain of the reset transistor is connected to the second sensor gate line.

8. The touchscreen apparatus of claim 1, further comprising:
display gate lines connected to the respective pixel rows to provide display gate signals for sequentially activating the pixel rows.

9. The touchscreen apparatus of claim 8, wherein each of the pixels includes a pixel cell and a driving transistor configured to switch the respective pixel cell on and off, a gate of the driving transistor being connected to the display gate line and a source of the driving transistor being connected to the respective pixel cell.

10. The touchscreen apparatus of claim 9, further comprising:
a display data line connected to a drain of the driving transistor.

11. The touchscreen apparatus of claim 8, wherein the touchscreen apparatus is configured to, after activating one of two display gate lines connected to two pixel rows which are adjacent to the light-sensing unit and the touch-sensing unit, sequentially activate the first sensor gate line, the second sensor gate line, and the other of the two display gate lines.

12. The touchscreen apparatus of claim 1, wherein the light-sensing unit comprises:
a light sensor transistor configured to generate a drain current in an off state according to an intensity of light;
a switch transistor configured to read the drain current in the off state of the light sensor transistor; and
a sensor data line configured to output the drain current.

13. The touchscreen apparatus of claim 12, wherein a gate of the switch transistor is connected to the first sensor gate line, a drain of the switch transistor is connected to a source of the light sensor transistor, and a source of the switch transistor is connected to the sensor data line, and
wherein a gate of the light sensor transistor is connected to the second sensor gate line and a drain of the light sensor transistor is connected to the first sensor gate line.

14. The touchscreen apparatus of claim 12, wherein the light-sensing unit comprises multiple light sensor transistors connected in parallel.

15. The touchscreen apparatus of claim 12, wherein the light sensor transistor is an oxide semiconductor transistor including a channel layer having an oxide semiconductor material.

16. A method of driving a touchscreen apparatus, the method comprising:
activating a first pixel row including pixels;
activating one of a light-sensing unit for sensing incident light and a touch-sensing unit for sensing a physical touch, the light-sensing unit and the touch-sensing unit being adjacent to the first pixel row, and resetting the other of the light-sensing unit and the touch-sensing unit;
resetting the activated one of the light-sensing unit and the touch-sensing unit and activating the reset other of the light-sensing unit and the touch-sensing unit; and
activating a second pixel row including additional pixels, the second pixel row being adjacent to the light-sensing unit and the touch-sensing unit,
applying a common voltage to the pixels when the first and second pixel rows are in an activated state, and prohibit providing the common voltage to the pixels when the light-sensing unit or the touch-sensing unit is in an activated state.

17. The method of claim 16, wherein the pixels in the first and second pixel rows are commonly connected to one common electrode.

18. The method of claim 17, further comprising:
applying a common voltage to a common voltage line, the touchscreen apparatus including a reset transistor connected between the common voltage line and the common electrode, and a reset gate line configured to provide a gate signal to the reset transistor; and switching the reset transistor to provide the common voltage to the pixels in an activated state of the pixels and prohibit providing the common voltage to the pixels in the activated state of one of the light-sensing unit and the touch-sensing unit.

19. The method of claim 18, further comprising:

maintaining a constant common voltage; and activating the reset gate line is activated in the activated state of the pixels to turn on the reset transistor and deactivating the reset gate line in the activated state of the light-sensing unit or the touch-sensing unit to turn off the reset transistor.

20. The method of claim 16, wherein the touchscreen apparatus comprises first and second sensor gate lines connected to the light-sensing unit and the touch-sensing unit, the light-sensing unit is activated and the touch-sensing unit is reset in an activated state of the first sensor gate line, and the touch-sensing unit is activated and the light-sensing unit is reset in an activated state of the second sensor gate line.

\* \* \* \* \*